(12) United States Patent
Collins et al.

(10) Patent No.: US 9,613,835 B2
(45) Date of Patent: Apr. 4, 2017

(54) HEATING LAMP ASSEMBLY

(71) Applicant: APPLIED MATERIALS, INC., Santa Clara, CA (US)

(72) Inventors: Richard O. Collins, Santa Clara, CA (US); Nyi Oo Myo, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 498 days.

(21) Appl. No.: 14/195,331

(22) Filed: Mar. 3, 2014

(65) Prior Publication Data

US 2014/0270732 A1 Sep. 18, 2014

Related U.S. Application Data

(60) Provisional application No. 61/787,652, filed on Mar. 15, 2013.

(51) Int. Cl.
*F26B 3/30* (2006.01)
*H01L 21/67* (2006.01)
*H05B 3/00* (2006.01)

(52) U.S. Cl.
CPC ...... *H01L 21/67115* (2013.01); *H05B 3/0047* (2013.01); *H05B 2203/032* (2013.01)

(58) Field of Classification Search
None
See application file for complete search history.

(56) References Cited

U.S. PATENT DOCUMENTS

| | | | | | |
|---|---|---|---|---|---|
| 1,669,314 | A | * | 5/1928 | Vreeland | F21L 4/00 362/188 |
| 2,017,714 | A | * | 10/1935 | Geiger | F21S 48/1104 362/296.07 |
| 2,063,090 | A | * | 12/1936 | Geiger | F21S 48/1113 313/318.11 |
| 2,139,374 | A | * | 12/1938 | Michel | F21V 19/0005 313/318.01 |
| 2,835,790 | A | * | 5/1958 | Divendal | F21V 17/00 362/293 |
| 3,621,232 | A | * | 11/1971 | Hough | F21S 48/10 362/306 |
| 3,652,846 | A | * | 3/1972 | Starck, II | F21L 15/06 313/25 |

(Continued)

OTHER PUBLICATIONS

International Search Report and Written Opinion mailed Jun. 2, 2013 for PCT Application No. PCT/US2013/026645.

(Continued)

*Primary Examiner* — Thor Campbell
(74) *Attorney, Agent, or Firm* — Moser Taboada; Alan Taboada

(57) ABSTRACT

Embodiments of heating lamps and heating lamp assemblies are disclosed herein. In some embodiments, a heating lamp may include a bulb; a reflector circumscribing the bulb proximate a first end of the bulb; a base coupled to the reflector on a side opposite the bulb; a handle coupled to the base on a side opposite the reflector, wherein the handle comprises a body having a first end coupled to the base and an opposing second end; a first conductor extending from the bulb and through the base and the handle in a direction opposite the bulb; and a second conductor extending from the bulb and through the base and the handle in a direction opposite the bulb.

14 Claims, 3 Drawing Sheets

(56) References Cited

U.S. PATENT DOCUMENTS

| | | | | | |
|---|---|---|---|---|---|
| 3,760,327 | A | * | 9/1973 | Whitehead | F21S 48/212 439/556 |
| 3,784,867 | A | * | 1/1974 | Dupree | H01K 1/46 29/600 |
| 3,936,686 | A | * | 2/1976 | Moore | F21V 29/004 313/113 |
| 4,019,045 | A | * | 4/1977 | Bassett | F21S 48/1113 362/548 |
| 4,841,422 | A | * | 6/1989 | Groh | F21V 19/0005 362/294 |
| 5,268,613 | A | * | 12/1993 | Cunningham | F21S 8/00 313/113 |
| 5,420,769 | A | * | 5/1995 | Ahlgren | F21V 29/004 165/80.3 |
| 5,458,505 | A | * | 10/1995 | Prager | F21V 19/006 361/695 |
| 5,873,650 | A | * | 2/1999 | Luk | F21V 19/0005 362/294 |
| 6,167,195 | A | * | 12/2000 | Moslehi | C23C 16/481 118/724 |
| 6,476,362 | B1 | * | 11/2002 | Deacon | H01L 21/67115 118/50.1 |
| 6,744,187 | B1 | * | 6/2004 | Wimberly | H01K 1/26 313/110 |
| 7,522,822 | B2 | * | 4/2009 | Trujillo | H01K 1/58 313/17 |
| 2004/0156625 | A1 | | 8/2004 | Garmer et al. | |
| 2005/0146257 | A1 | * | 7/2005 | Trujillo | H01L 21/67115 313/17 |
| 2005/0276063 | A1 | | 12/2005 | Coushaine et al. | |
| 2006/0066193 | A1 | * | 3/2006 | Ranish | H05B 3/0047 313/116 |
| 2006/0249695 | A1 | | 11/2006 | Choi | |
| 2013/0223824 | A1 | | 8/2013 | Myo | |
| 2013/0269613 | A1 | | 10/2013 | Sanchez et al. | |

OTHER PUBLICATIONS

International Search Report and Written Opinion mailed Dec. 17, 2014 for PCT Application No. PCT/US2014/020132.

* cited by examiner ered body circumscribes the handle, the base and the reflector; and (ii) a plurality of slots proximate the second end, wherein each slot is configured to retain a corresponding pin.

HEATING LAMP ASSEMBLY

CROSS-REFERENCE TO RELATED APPLICATIONS

This application claims benefit of U.S. provisional patent application Ser. No. 61/787,652, filed Mar. 15, 2013, which is herein incorporated by reference in its entirety.

FIELD

Embodiments of the present invention generally relate to semiconductor processing using heating lamps.

BACKGROUND

The inventor has observed that current heating lamp assemblies utilized within epitaxial deposition processing chambers typically require the entire heating lamp assembly to be removed from the processing chamber in order to replace a non-functioning heating lamp, adversely leading to increased downtime and reduced process manufacturing times. In addition, the inventor has observed that space limitations in newer epitaxial deposition processing chambers prevent the use of current apparatus to couple individual heating lamps to the heating lamp assembly, which can be costly and require a significant amount of space.

Therefore, the inventor has provided embodiments of an improved heating lamp assembly.

SUMMARY

Embodiments of heating lamps and heating lamp assemblies for use in, for example, semiconductor substrate processing are disclosed herein. In some embodiments, a heating lamp may include a bulb; a reflector circumscribing the bulb proximate a first end of the bulb; a base coupled to the reflector on a side opposite the bulb; a handle coupled to the base on a side opposite the reflector, wherein the handle comprises a body having a first end coupled to the base and an opposing second end; a first conductor extending from the bulb and through the base and the handle in a direction opposite the bulb; and a second conductor extending from the bulb and through the base and the handle in a direction opposite the bulb.

In some embodiments, a lamp assembly for use in a substrate processing chamber may include (a) a plurality of heating lamps, wherein each heating lamp comprises (i) a bulb; (ii) a reflector circumscribing the bulb proximate a first end of the bulb; (iii) a base coupled to the reflector on a side opposite the bulb; (iv) a handle coupled to the base on a side opposite the reflector, wherein the handle comprises a body having a first end coupled to the base and an opposing second end; (v) a first conductor extending from the bulb and through the base and the handle in a direction opposite the bulb; (vi) a second conductor extending from the bulb and through the base and the handle in a direction opposite the bulb; and (vii) a plurality of pins disposed about the outer surface of the body of the handle, wherein the plurality of pins are unequally spaced; (b) an annular body comprising a sidewall having an outer surface, an inner surface defining a central opening in the annular body, and a plurality of openings disposed through the sidewall to allow the bulb of the heating lamp to pass into the central opening; and (c) a plurality of lamp sockets, wherein a lamp socket comprises (i) an elongated body having a first end coupled to the outer surface of the annular body at an opening in the sidewall, and a second end having an opening to pass the heating lamp through the elongated body, wherein the elongated body circumscribes the handle, the base and the reflector; and (ii) a plurality of slots proximate the second end, wherein each slot is configured to retain a corresponding pin.

In some embodiments, a substrate processing chamber may include a chamber body having an inner volume; a substrate support pedestal having a substrate supporting surface to support a substrate; and a lamp assembly disposed at least one of above or below the substrate, the lamp assembly comprising (a) a plurality of heating lamps, wherein each heating lamp, the lamp assembly comprising (i) a bulb; (ii) a reflector circumscribing the bulb proximate a first end of the bulb; (iii) a base coupled to the reflector on a side opposite the bulb; (iv) a first conductor extending from the bulb and through the base and the handle in a direction opposite the bulb; (v) a second conductor extending from the bulb and through the base and the handle in a direction opposite the bulb; (vi) a first spring circumscribing a portion of the first conductor; (vii) a second spring circumscribing a portion of the second conductor within the body of the handle; (viii) a handle coupled to the base on a side opposite the reflector, wherein the handle comprises a body having a first end coupled to the base and an opposing second end; and (ix) a plurality of pins disposed about the outer surface of the body of the handle, wherein the plurality of pins are unequally spaced; (b) an annular body comprising a sidewall having an outer surface, an inner surface defining a central opening in the annular body, and a plurality of openings disposed through the sidewall to allow the bulb of the heating lamp to pass into the central opening; and (c) a plurality of lamp sockets, wherein a lamp socket comprises (i) an elongated body having a first end coupled to the outer surface of the annular body at an opening in the sidewall, and a second end having an opening to pass the heating lamp through the elongated body, wherein the elongated body circumscribes the handle, the base and the reflector; and (ii) a plurality of slots proximate the second end, wherein each slot is configured to retain a corresponding pin.

Other and further embodiments of the present invention are described below.

BRIEF DESCRIPTION OF THE DRAWINGS

Embodiments of the present invention, briefly summarized above and discussed in greater detail below, can be understood by reference to the illustrative embodiments of the invention depicted in the appended drawings. It is to be noted, however, that the appended drawings illustrate only typical embodiments of this invention and are therefore not to be considered limiting of its scope, for the invention may admit to other equally effective embodiments.

Figure 1:
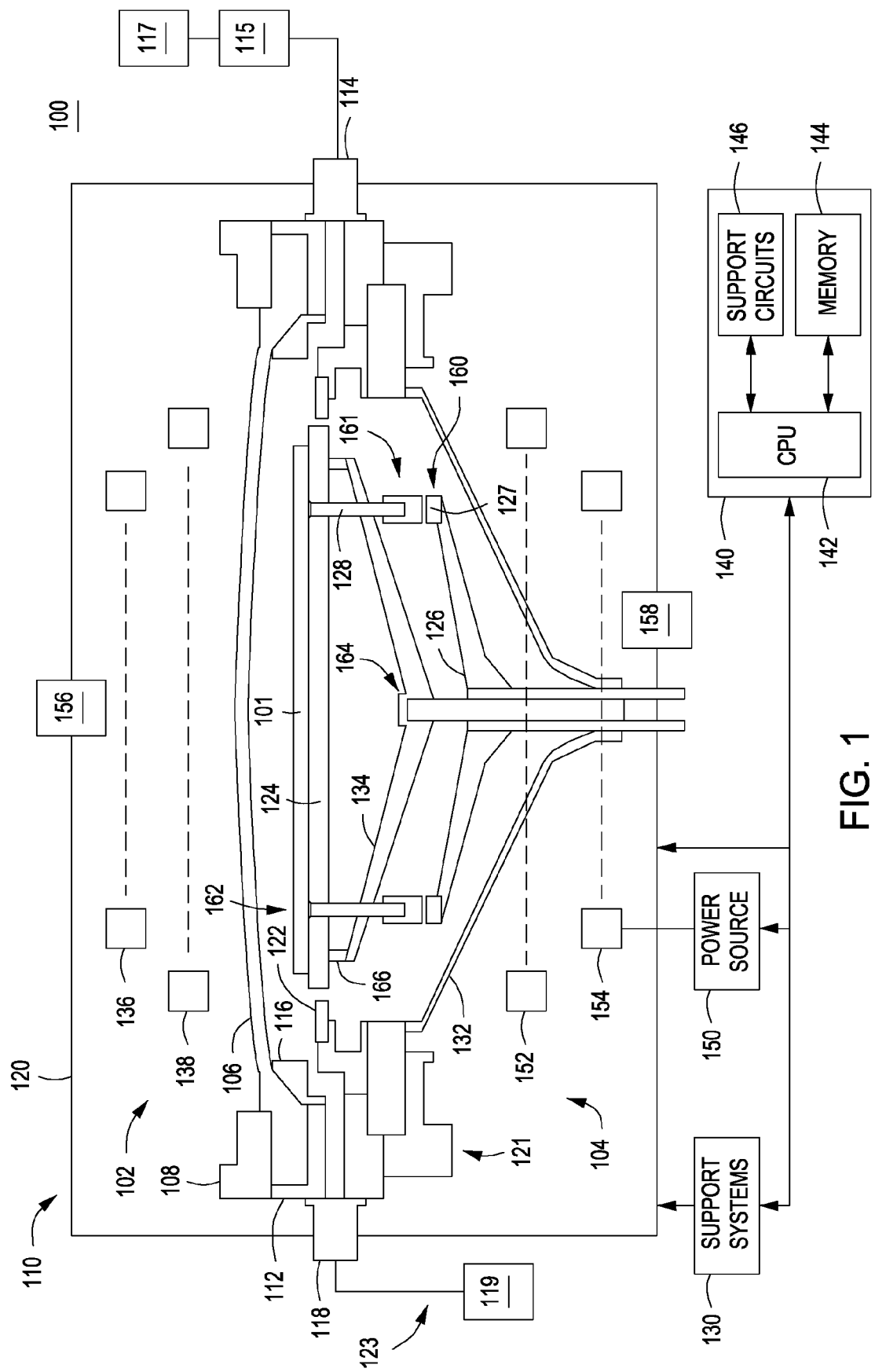
FIG. 1 is a process chamber suitable for use with a heating lamp assembly in accordance with some embodiments of the present invention.

To facilitate understanding, identical reference numerals have been used, where possible, to designate identical elements that are common to the figures. The figures are not drawn to scale and may be simplified for clarity. It is contemplated that elements and features of one embodiment may be beneficially incorporated in other embodiments without further recitation.

DETAILED DESCRIPTION

Embodiments of the present invention may advantageously provide heating lamp assemblies that allow a non-functioning heating lamp to be replaced without removing the entire heating assembly from within the substrate processing chamber. The inventive heating lamp assembly may further advantageously provide improved registration of the heating lamp with the reflector.

FIG. 1 depicts a schematic side view of a process chamber 100 suitable for use with a heating lamp assembly in accordance with some embodiments of the present invention. In some embodiments, the process chamber 100 may be a commercially available process chamber, such as any of the EPI® reactors, available from Applied Materials, Inc. of Santa Clara, Calif., or any suitable semiconductor process chamber that may use heating lamps as described herein. Other process chambers that use heating lamp assemblies may also benefit from the teachings provided herein.

The process chamber 100 may generally comprise a chamber body 110, support systems 130, a controller 140, and a power source 150. The chamber body 110 generally includes an upper portion 102, a lower portion 104, and an enclosure 120. A vacuum system 123 may be coupled to the chamber body 110 to facilitate maintaining a desired pressure within the chamber body 110. In some embodiments, the vacuum system 123 may comprise a throttle valve (not shown) and vacuum pump 119 which are used to exhaust the chamber body 110. In some embodiments, the pressure inside the chamber body 110 may be regulated by adjusting the throttle valve and/or vacuum pump 119.

The upper portion 102 is disposed on the lower portion 104 and includes a lid 106, a clamp ring 108, a liner 116, a baseplate 112, an upper heating lamp assembly 136 and a lower heating lamp assembly 138, and an upper pyrometer 156. In some embodiments, the lid 106 has a dome-like form factor, however, lids having other form factors (e.g., flat or reverse curve lids) are also contemplated.

The lower portion 104 is coupled to a process gas intake port 114 and an exhaust port 118 and comprises a baseplate assembly 121, a lower dome 132, a substrate support 124, a pre-heat ring 122, a substrate lift assembly 160, a substrate support assembly 164, an upper heating lamp assembly 152 and a lower heating lamp assembly 154, and a lower pyrometer 158. Although the term "ring" is used to describe certain components of the process chamber 100, such as the pre-heat ring 122, it is contemplated that the shape of these components need not be circular and may include any shape, including but not limited to, rectangles, polygons, ovals, and the like. In some embodiments, a gas supply 117 may provide one or more process gases to the process chamber 100 via the inlet 114. In such embodiments, a valve or mass flow controller 115 may be coupled to the gas supply 117 to control a flow of process gases from the gas supply 117. The lid 106, the clamp ring 108, and the lower dome 132 are formed from quartz; however, other IR-transparent and process compatible materials may also be used to form these components.

During processing, the substrate 101 is disposed on the substrate support 124. One or more heating lamp assemblies (e.g., 136, 138, 152, and 154) comprising a plurality of heating lamps, which are sources of infrared (IR) radiation (e.g., heat), are used to generate a pre-determined temperature distribution across the substrate 101. The one or more heating lamp assemblies (e.g., 136, 138, 152, and 154) receive power from the power source 150. A heating lamp 200 in accordance with some embodiments of the present invention, and suitable for use in the heating lamp assembly, is described below with respect to FIG. 2. A heating lamp assembly 400 in accordance with some embodiments of the present invention is described below with respect to FIG. 4.

The substrate support assembly 164 generally includes a support bracket 134 having a plurality of support pins 166 coupled to the substrate support 124. The substrate lift assembly 160 comprises a substrate lift shaft 126 and a plurality of lift pin modules 161 selectively resting on respective pads 127 of the substrate lift shaft 126. In one embodiment, a lift pin module 161 comprises an optional upper portion of the lift pin 128 is movably disposed through a first opening 162 in the substrate support 124. In operation, the substrate lift shaft 126 is moved to engage the lift pins 128. When engaged, the lift pins 128 may raise the substrate 101 above the substrate support 124 or lower the substrate 101 onto the substrate support 124.

The support systems 130 include components used to execute and monitor pre-determined processes (e.g., growing epitaxial films) in the process chamber 100. Such components generally include various sub-systems. (e.g., gas panel(s), gas distribution conduits, vacuum and exhaust sub-systems, and the like) and devices (e.g., power supplies, process control instruments, and the like) of the process chamber 100. These components are well known to those skilled in the art and are omitted from the drawings for clarity.

The controller 140 may be provided and coupled to the process chamber 100 for controlling the components of the process chamber 100. The controller 140 may be any suitable controller for controlling the operation of a substrate process chamber. The controller 140 generally comprises a Central Processing Unit (CPU) 142, a memory 144, and support circuits 146 and is coupled to and controls the process chamber 100, support systems 130, and the power source 150, directly (as shown in FIG. 1) or, alternatively, via computers (or controllers) associated with the process chamber and/or the support systems.

The CPU 142 may be any form of a general purpose computer processor that can be used in an industrial setting. The support circuits 146 are coupled to the CPU 142 and may comprise cache, clock circuits, input/output subsystems, power supplies, and the like. Software routines may be stored in the memory 144 of the controller 140. The software routines, when executed by the CPU 142, transform the CPU 142 into a specific purpose computer (controller) 140. The software routines may also be stored and/or executed by a second controller (not shown) that is located remotely from the controller 140. Alternatively or in combination, in some embodiments, for example where the process chamber 100 is part of a multi-chamber processing system, each process chamber of the multi-chamber processing system may have its own controller for controlling portions of the inventive methods disclosed herein that may be performed in that particular process chamber. In such embodiments, the individual controllers may be configured similar to the controller 140 and may be coupled to the controller 140 to synchronize operation of the process chamber 100.

Figure 2:
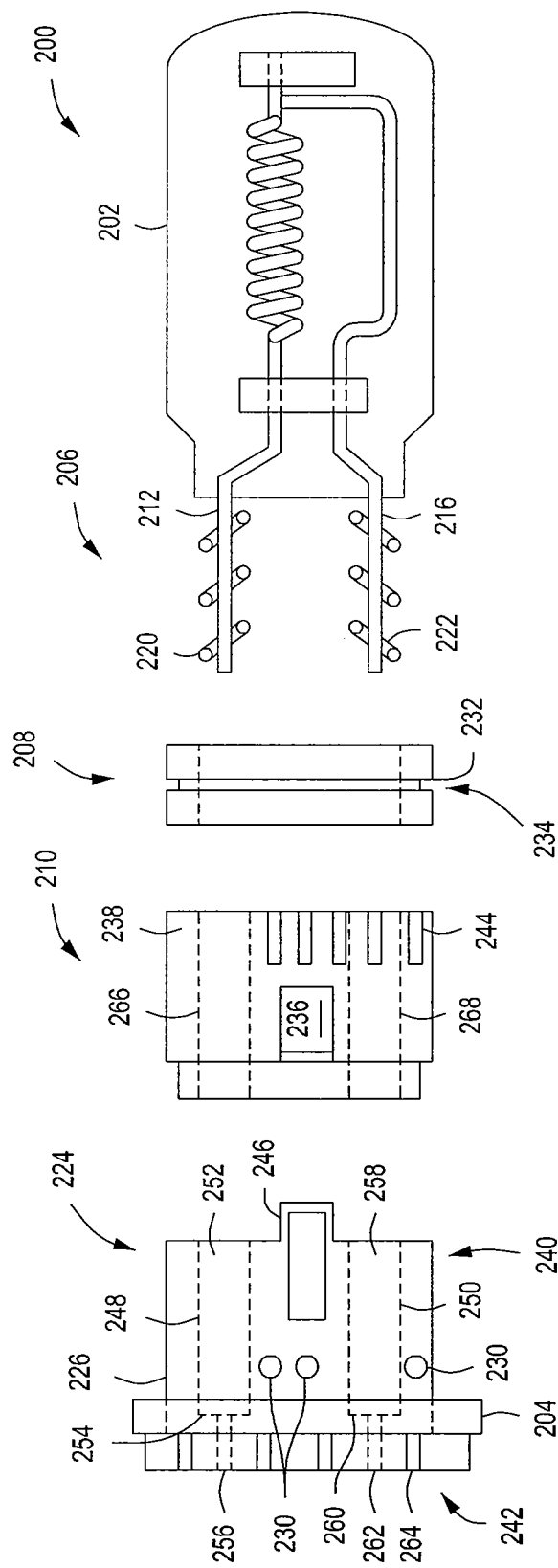
FIG. 2 is an exploded side view of a heating lamp in accordance with some embodiments of the present invention.

FIG. 2 depicts a heating lamp 200 in accordance with some embodiments of the present invention. In some embodiments, a heating lamp 200 may generally comprise a bulb 202, a reflector 208, a handle 224, a first conductor 212 and a second conductor 216. In some embodiments, the bulb 202 may be formed of a transparent or semi-transparent material, such as quartz, glass, or other suitable materials. In some embodiments, bulb 202 may be a low-voltage bulb, for example a bulb having a voltage of about 120 to about 480. In some embodiments, the bulb comprises a first end 206 and an inner volume having a filament disposed therein to provide heat energy when electric current is provided to the filament of the heating lamp 200.

The reflector 208 circumscribes the bulb 202 proximate the first end 206. In some embodiments, the reflector 208 is comprised of a first half and a second half. In some embodiments, the first half of the reflector 208 and the second half of the reflector 208 circumscribe the bulb 202 and are coupled together by a clip 232. In some embodiments, the clip 232 is retained within a groove 234 along the outer surface of the reflector 208. In some embodiments, the reflector 208 and the clip 232 are coated with a reflective material such as gold or any suitable materials that are greater than about 95% reflective.

In some embodiments, the base 210 is coupled to the reflector 208 on a side opposite the bulb 202. In some embodiments, the base 210 is made of a non-conductive material, for example a ceramic such as aluminum oxide ($Al_2O_3$) or the like. In some embodiments, the base 210 may provide support to the lamp 200, such as by being held in a lamp socket 300 described below with respect to FIG. 3. In some embodiments, the base 210 comprises an outer surface 238 having a plurality of fins 244 to dissipate heat from the bulb 202.

The handle 224 is coupled to the base 210 on a side opposite the reflector 208. The handle 224 generally comprises a body 226 having a first end 240 and an opposing second end 242. In some embodiments, the handle 224 is coupled to the base 210. In some embodiments, the handle 224 has one or more clips 246 disposed along an inner surface of the handle 224, proximate the first end 240 of the handle 224. In some embodiments, the one or more clips 246 couples the handle 224 to the base 210 by engaging corresponding recesses 236 disposed along an outer surface 238 of the base 210.

The first conductor 212, extending from the bulb 202 in a direction opposite the bulb 202, extends through the base 210 and the handle 224. In some embodiments, the base 210 comprises a first opening 266 for the first conductor 212 to extend through. A first spring 220 circumscribes a portion of the first conductor 212 within the handle body 226. In some embodiments, the handle 224 further comprises an inner volume having a first tube 248 extending from the first end 240 of the handle 224 to the second end 242 of the handle 224. The first tube 248 retains the first spring 220 and the first conductor 212. In some embodiments, the first tube 248 comprises a first opening 252 at a first end 240 of the handle 224 to engage the first spring 220 and the first conductor 212. In some embodiments, the first tube 248 comprises a surface 254 opposite the first opening 252 of the first tube 248. The surface 254 has a second opening 256 to engage the first conductor 212 and bias the first spring 220 toward the base 210 when the heating lamp 200 is assembled.

A second conductor 216, extending from the bulb 202 in a direction opposite the bulb 202, extends through the base 210 and the handle 224. In some embodiments, the base 210 comprises a second opening 268 for the second conductor 216 to extend through. A second spring 222 circumscribes a portion of the second conductor 216 within the handle body 226. In some embodiments, the inner volume of the handle 224 further comprises a second tube 250 extending from the first end 240 of the handle 224 to the second end 242 of the handle 224. The second tube 250 retains the second spring 222 and the second conductor 216. In some embodiments, the second tube 250 comprises a first opening 258 at a first end 240 of the handle 224 to engage the second spring 222 and the second conductor 216. In some embodiments, the second tube 250 comprises a surface 260 opposite the first opening 258 of the second tube 250. The surface 260 has a second opening 262 to engage the second conductor 216 and bias the second spring 222 toward the base 210 when the heating lamp 200 is assembled. To facilitate the delivery of power to the bulb 202, the power source 150 may be coupled to the first conductor 212 through the first tube 248 and coupled to the second conductor 216 through the second tube 250.

In some embodiments, the handle 224 further comprises a plurality of pins 230 disposed about an outer surface of the handle body 226. In some embodiments, the plurality of pins 230 are unequally spaced. The unequally spaced pins 230 advantageously prevent the heating lamp 200 from being improperly installed within a heating lamp assembly 400 described below with respect to FIG. 4. In some embodiments, the plurality of pins 230 comprises three pins, although other numbers of pins may be used. In some embodiments, a first pin is spaced about 115 degrees from a second pin, the second pin is spaced about 115 degrees from a third pin, and the third pin is spaced about 130 degrees from the first pin.

In some embodiments, the handle 224 further comprises an outer surface having a contoured portion 264 proximate the second end 242 configured to provide a grip for the heating lamp 200. In some embodiments, the contoured portion 264 of the handle 224 comprises a wave-like structure having a plurality of peaks and valleys to provide an adequate gripping surface. The gripping surface advantageously eases installing and removing the heating lamp 200 from the heating lamp assembly 400 by preventing the heating lamp 200 from slipping from the hand.

In some embodiments, the handle 224 further comprises a gasket 204 circumscribing the handle body 226 proximate the second end 242. In some embodiment, the gasket 204 is disposed between the contoured portion 264 of the handle 224 and the plurality of pins 230. When the heating lamp is coupled to the heating lamp assembly 400 through the lamp socket 300, as described below with respect to FIG. 4, the gasket 204 provides a seal between the first end of the lamp socket 300 and the contoured portion 264 of the handle 224 to prevent air from flowing into the heating lamp 200.

Figure 3:
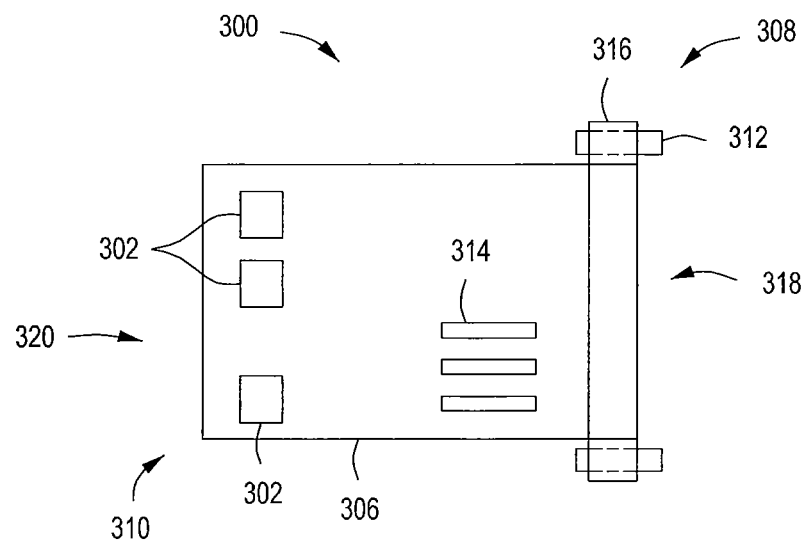
FIG. 3 is a side view of a portion of a heating lamp in accordance with some embodiments of the present invention.

FIG. 3 depicts a lamp socket 300 in accordance with some embodiments of the present invention. The lamp socket 300 is coupled to the heating lamp assembly 400 described in FIG. 4 and is used to hold the heating lamp 200 within the heating lamp assembly 400. In some embodiments, the lamp socket 300 comprises an elongated body 306 having a first end 308 and a second end 310. In some embodiments, the lamp socket body 306 comprises a first opening 318 at the first end 308 and a second opening 320 at the second end 310 for the heating lamp 200 to pass through the elongated body 306 when installing the heating lamp 200 within the heating lamp assembly 400.

In some embodiments, the lamp socket 300 comprises a plurality of slots 302 disposed proximate the second end 310. In some embodiments, each slot 302 is configured to retain a corresponding pin 230 when a heating lamp 200 is installed within the heating lamp assembly 400. In some embodiments, the lamp socket 300 comprises a plurality of openings 314 proximate the first end 308 to dissipate heat from the heating lamp 200.

In some embodiments, the lamp socket 300 comprises a plurality of fasteners 312 proximate the first end 308 to couple the lamp socket 300 to the heating lamp assembly 400. In some embodiments, the fasteners 312 can be mounting screws. In some embodiments, the mounting screws are unequally spaced about a base 316 proximate the first end 308. For example, in some embodiments, the lamp socket 300 comprises three mounting screws 312, spaced at about 135 degrees, about 135 degrees and about 90 degrees apart.

Figure 4:
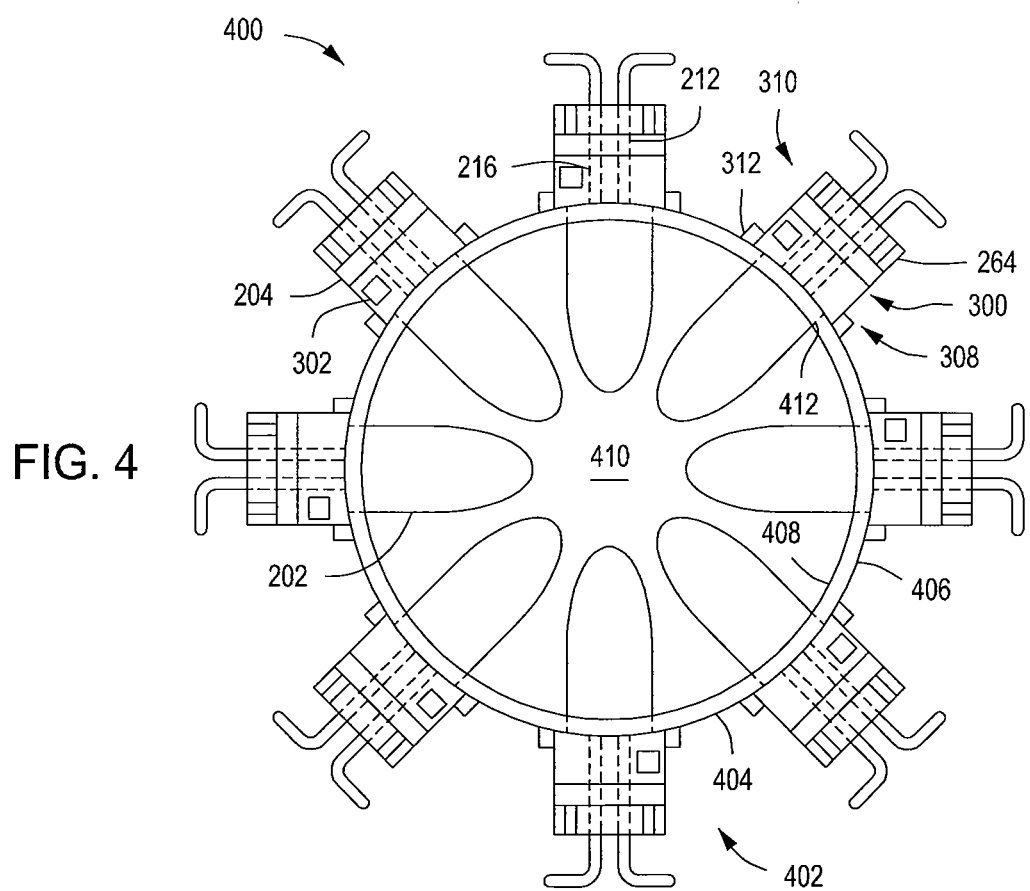
FIG. 4 is a schematic top view of a heating lamp assembly suitable for use with a process chamber in accordance with some embodiments of the present invention.

FIG. 4 depicts a heating lamp assembly 400 suitable for use with a process chamber in accordance with some embodiments of the present invention. In some embodiments, a plurality of heating lamp 200 may be arranged or configured within the heating lamp assembly 400 in any manner suitable to provide a desired temperature profile within the process chamber 100 to facilitate a process within the process chamber 100. For example, in some embodiments, a plurality of heating lamps 200 may be arranged in an array, for example, such as the circular array as depicted in FIG. 4.

In some embodiments, the heating lamp assembly 400 comprises an annular body 402 having a sidewall 404. In some embodiments, the sidewall 404 has an outer surface 406 and an inner surface 408. In some embodiments, the inner surface 408 defines a central opening 410 in the annular body 402. In some embodiments a plurality of openings 412 are disposed through the sidewall 404 to allow the bulb 202 of the heating lamp 200 to pass into the central opening 410. In some embodiments, the lamp socket 300 is coupled at a first end 308 to the outer surface 404 of the heating lamp assembly 400. In some embodiments, the lamp socket 300 is coupled to the outer surface 406 by a plurality of fasteners 312. In some embodiments, the lamp socket 300 is coupled to the outer surface 404 at an opening 412.

The heating lamp 200 can be inserted or removed from the lamp socket 300 via the opening proximate the second end 310. Installing the heating lamp 200 via the opening proximate the second end 310 of the lamp socket 300 advantageously allows the heating lamp 200 to be installed into the lamp assembly 400 without removing the entire lamp assembly 400 from the process chamber 100. The heating lamp 200 is disposed through the elongated body 306 of the lamp socket 300 until the bulb 202, disposed through the opening proximate the first end 308 and through the opening 412 in the sidewall 404 of the lamp assembly 400, is disposed within the central opening 410 of the lamp assembly. The contoured portion 264 of the handle 224 advantageously provides an improved grip on the heating lamp 200 when installing the heating lamp 200 in the heating lamp assembly 400.

The heating lamp 200 is inserted into the lamp socket 300 and rotated until each of the pins 230 on the handle body 226 is disposed through each of the corresponding slots 302 in the lamp socket 300 in order to hold the heating lamp 200 in place. In addition, the unequal spacing of the plurality of pins 230 advantageously prevents the heating lamp 200 from being improperly positioned within the heating lamp assembly 400. The inventors have observed that this design advantageously enables the consistent placement of the heating lamp 200 in relation to the reflector 208 during a heating lamp 200 replacement process. Upon locking the heating lamp 200 into position via the pins 230 and the slots 302, the first spring 220 and the second spring 222 are biased toward the base 210. As a result, the first spring 220 and the second spring 222 push the heating lamp 200 toward the first end 308 of the lamp socket 300 increasing the registration of the heating lamp 200 to the reflector 208 for better process uniformity.

In some embodiments, where the distance across the base 316 of opposing lamp sockets 300 is about 309 mm, and where the lamp assembly 400 comprises fewer than 24 heating lamps 200, the spacing between the heating lamps 200 is determined by the bulb 202. For example, in a lamp assembly 400 using 20 heating lamps 200, where the bulb 202 diameter is about 26 mm and the width of the base 316 of the lamp socket 300 is about 49 mm, the angle between the heating lamps 200 is about 9 degrees. In some embodiments, where the distance across the base 316 of opposing lamp sockets 300 is about 309 mm, and where the lamp assembly 400 comprises 24 heating lamps 200 or greater, the spacing between the heating lamps 200 is determined by the lamp socket 300. For example, in a lamp assembly 400 using 24 heating lamps 200, where the bulb 202 diameter is 26 mm and the width of the base 316 of the lamp socket 300 is 49 mm, the angle between the heating lamps 200 is about 7.5 degrees.

While the foregoing is directed to embodiments of the present invention, other and further embodiments of the invention may be devised without departing from the basic scope thereof.

The invention claimed is:

1. A heating lamp for use in a semiconductor process chamber, comprising:
   a bulb;
   a reflector circumscribing the bulb proximate a first end of the bulb;
   a base coupled to the reflector on a side opposite the bulb;
   a handle coupled to the base on a side opposite the reflector, wherein the handle comprises a body having a first end coupled to the base and an opposing second end;
   a first conductor extending from the bulb and through the base and the handle in a direction opposite the bulb;
   a second conductor extending from the bulb and through the base and the handle in a direction opposite the bulb;
   a first spring circumscribing a portion of the first conductor within the body of the handle; and
   a second spring circumscribing a portion of the second conductor within the body of the handle;
   wherein the handle comprises an inner volume having a first tube extending from the first end of the handle to the second end of the handle to retain the first spring and the first conductor, and a second tube extending from the first end of the handle to the second end of the handle to retain the second spring and the second conductor; and
   wherein the first tube comprises a first opening at a first end of the handle to engage the first spring and the first conductor, and a surface, opposite the first opening of the first tube, having a second opening to engage the first conductor, wherein the surface biases the first spring toward the base when the heating lamp is assembled.

2. The heating lamp of claim 1, wherein the second tube comprises a first opening at a first end of the handle to engage the second spring and the second conductor, and a surface, opposite the first opening of the second tube, having a second opening to engage the second conductor, wherein the surface biases the second spring toward the base when the heating lamp is assembled.

3. The heating lamp of claim 1, wherein the base has an outer surface comprising a plurality of fins to dissipate heat from the bulb.

4. The heating lamp of claim 1, wherein the handle comprises one or more clips disposed along an inner surface of the handle, proximate the first end of the handle, and wherein the base comprises corresponding recesses disposed along an outer surface of the base to engage the one or more clips to couple the handle to the base.

5. The heating lamp of claim 1, wherein the handle comprises an outer surface having a contoured portion proximate the second end configured to provide a grip for the handle.

6. The heating lamp of claim 1, wherein the handle comprises a plurality of pins disposed about an outer surface of the body, and wherein the plurality of pins are unequally spaced.

7. The heating lamp of claim 6, wherein the plurality of pins comprises three pins, and wherein a first pin is spaced 115 degrees from a second pin, the second pin is spaced 115 degrees from a third pin, and the third pin is spaced 130 degrees from the first pin.

8. The heating lamp of claim 1, further comprising a gasket circumscribing the body of the handle proximate a second end.

9. A lamp assembly for use in a substrate processing chamber, comprising:
(a) a plurality of heating lamps, wherein each heating lamp comprises:
  (i) a bulb;
  (ii) a reflector circumscribing the bulb proximate a first end of the bulb;
  (iii) a base coupled to the reflector on a side opposite the bulb;
  (iv) a handle coupled to the base on a side opposite the reflector, wherein the handle comprises a body having a first end coupled to the base and an opposing second end;
  (v) a first conductor extending from the bulb and through the base and the handle in a direction opposite the bulb;
  (vi) a second conductor extending from the bulb and through the base and the handle in a direction opposite the bulb;
  (vii) a plurality of pins disposed about an outer surface of the body of the handle, wherein the plurality of pins are unequally spaced;
  (viii) a first spring circumscribing a portion of the first conductor within the body of the handle; and
  (ix) a second spring circumscribing a portion of the second conductor within the body of the handle;
  wherein the handle comprises an inner volume having a first tube extending from the first end of the handle to the second end of the handle to retain the first spring and the first conductor, and a second tube extending from the first end of the handle to the second end of the handle to retain the second spring and the second conductor; and
  wherein the first tube comprises a first opening at a first end of the handle to engage the first spring and the first conductor, and a surface, opposite the first opening of the first tube, having a second opening to engage the first conductor, wherein the surface biases the first spring toward the base when the heating lamp is assembled;
(b) an annular body comprising a sidewall having an outer surface, an inner surface defining a central opening in the annular body, and a plurality of openings disposed through the sidewall to allow the bulb of the heating lamp to pass into the central opening; and
(c) a plurality of lamp sockets, wherein a lamp socket comprises:
  (i) an elongated body having a first end coupled to the outer surface of the annular body at an opening in the sidewall, and a second end having an opening to pass the heating lamp through the elongated body, wherein the elongated body circumscribes the handle, the base and the reflector; and
  (ii) a plurality of slots proximate the second end, wherein each slot is configured to retain a corresponding pin.

10. The lamp assembly of claim 9, wherein the second tube comprises a first opening at a first end of the handle to engage the second spring and the second conductor, and a surface, opposite the first opening of the second tube, having a second opening to engage the second conductor, wherein the surface biases the second spring toward the base when the heating lamp is assembled.

11. The lamp assembly of claim 10, further comprising a power source coupled to the first conductor through the first tube and coupled to the second conductor through the second tube to provide power to the bulb.

12. The lamp assembly of claim 9, wherein the lamp socket comprises a plurality of openings proximate the first end to dissipate heat from the heating lamp.

13. The lamp assembly of claim 9, wherein the handle comprises an outer surface having a contoured portion proximate the second end configured to provide a grip for the handle when inserting the heating lamp into the lamp socket.

14. A substrate processing chamber, comprising:
a chamber body having an inner volume;
a substrate support pedestal having a substrate supporting surface to support a substrate; and
a lamp assembly disposed at least one of above or below the substrate, the lamp assembly comprising:
(a) a plurality of heating lamps, wherein each heating lamp comprises:
  (i) a bulb;
  (ii) a reflector circumscribing the bulb proximate a first end of the bulb;
  (iii) a base coupled to the reflector on a side opposite the bulb;
  (iv) a handle coupled to the base on a side opposite the reflector, wherein the handle comprises a body having a first end coupled to the base and an opposing second end;
  (v) a first conductor extending from the bulb and through the base and the handle in a direction opposite the bulb;
  (vi) a second conductor extending from the bulb and through the base and the handle in a direction opposite the bulb;
  (vii) a first spring circumscribing a portion of the first conductor within the body of the handle;
  (viii) a second spring circumscribing a portion of the second conductor within the body of the handle; and
  (ix) a plurality of pins disposed about an outer surface of the body of the handle, wherein the plurality of pins are unequally spaced;
  wherein the handle comprises an inner volume having a first tube extending from the first end of the handle to the second end of the handle to retain the first spring and the first conductor, and a second tube extending from the first end of the handle to the second end of the handle to retain the second spring and the second conductor; and wherein the first tube comprises a first opening at a first end of the handle to engage the first spring and the first conductor, and a surface, opposite the first opening of the first tube, having a second opening to engage the first conductor, wherein the surface biases the first spring toward the base when the heating lamp is assembled;

(b) an annular body comprising a sidewall having an outer surface, an inner surface defining a central opening in the annular body, and a plurality of openings disposed through the sidewall to allow the bulb of the heating lamp to pass into the central opening; and (c) a plurality of lamp sockets, wherein a lamp socket comprises:

(i) an elongated body having a first end coupled to the outer surface of the annular body at an opening in the sidewall, and a second end having an opening to pass the heating lamp through the elongated body, wherein the elongated body circumscribes the handle, the base and the reflector; and (ii) a plurality of slots proximate the second end, wherein each slot is configured to retain a corresponding pin.

* * * * *